United States Patent Office 3,271,488

Patented Sept. 6, 1966

3,271,488

METHOD OF MAKING MASKS FOR VAPOR DEPOSITION OF ELECTRODES

Reinhard Dahlberg, Gundelfingen, Germany, assignor, by mesne assignments, to International Telephone and Telegraph Corporation, New York, N.Y., a corporation of Maryland No Drawing. Filed Nov. 6, 1962, Ser. No. 235,879
Claims priority, application Germany, Nov. 21, 1961, I 20,864
1 Claim. (Cl. 264—81)

This invention relates to masks of the type frequently used in the vapor deposition of electrodes on semiconductor devices and particularly to methods of making such masks.

In recent years the use of vapor deposition to form both ohmic and rectifying junction contacts on semiconductor bodies has become an important technique in the commercial mass production of semiconductor devices. This technique is of particular importance in the formation of contacts which are of relatively complex geometry and/or of extremely small size, as required in high-frequency transistors.

A typical application of the technique is in the fabrication of high-frequency mesa transistors. A mask containing large numbers of precisely formed and dimensioned square holes is superposed on an appropriately-treated surface of a plate or slice of semiconductor material and the assembly is subjected to a suitable vapor deposition treatment whereby contact-forming material is deposited on selected regions of the surface exposed through the holes in the mask. In this manner upwards of 1000 emitters can be formed at one time. Similarly, in a subsequent step and using an appropriate mask, ohmic base contacts can be deposited simultaneously in close proximity to each emitter. The crystal slice is eventually subdivided to obtain individual devices.

The key to the success of the technique lies in the precision with which the mask is made and its stability (i.e., resistance to warping, buckling, etc.) under service conditions. Heretofore no satisfactory method has been available for making masks serviceable under some of the more stringent conditions encountered in device fabrication.

One of the principal shortcomings of masks presently available is their tendency to warp or buckle when exposed to the several hundred centigrade degree temperatures which are used to insure uniform alloying of vapor deposited films.

The various requirements for masks of maximum utility and performance are as follows:

(1) The dimensions of and distance between openings should be highly uniform.

(2) The openings should be as sharp-edged as possible.

(3) The masks should be substantially free of internal stresses and of the tendency to buckle either at room or at service temperatures.

(4) The thermal expansion coefficient of the mask material should match that of the semiconductor as closely as possible.

(5) The material of the mask should not affect the properties of the semiconductor even at high temperatures. Particularly, the material should not react chemically with the semiconductor nor change its carrier lifetime or resistivity.

Masks are sometimes made of nickel because it is easy to work with and lends itself to the fabrication of masks with high precision. Nevertheless, nickel is not a satisfactory material for masks used at high temperatures (i.e., of the order of several hundred centigrade degrees) because its thermal expansion coefficient is quite different from that of germanium and silicon, the most widely used semiconductors, and it affects their semiconductor properties.

Refractory metals such as tungsten, molybdenum and tantalum avoid the shortcomings of nickel but do not lend themselves to fabrication of masks of the same accuracy. With fabrication methods used heretofore, masks of these refractory metals were about one whole order of magnitude below the accuracy of nickel masks.

Various other techniques have been proposed for the fabrication of accurate masks but, for one reason or another, are not applicable to many of the materials, metals and non-metals, which are best suited to certain conditions of service. Thus, for example, many of the methods involve electroplating or chemical (electroless) plating and, therefore, are not applicable to metals which are difficult to plate with nor to non-metals, e.g., quartz which, of course, are impossible to deposit electrolytically.

It is the fundamental general object of the present invention to overcome or mitigate at least one of the problems of the prior art as outlined above.

A more specific object is the provision of an improved method for fabricating masks of extreme accuracy from refractory materials which do not lend themselves to electrolytic or electroless deposition provided they are resistant to dissolution by either chemical or electrochemical means.

These and additional objects are realized by methods of fabricating masks which, in accordance with the present invention, comprise making a replica of the mask out of a metal susceptible to chemical dissolution and adapted to the facile production of such a replica with high precision. Then, on one surface of the replica is vapor deposited under high vacuum conditions a cohesive coating of a selected refractory material resistant to chemical and/or electrochemical dissolution; thereafter the replica is dissolved away.

Further objects of the invention, its advantages, scope and the manner in which it can be practised will be more fully apparent to persons conversant with the art from the following description of exemplary embodiments thereof taken in conjunction with the subjoined claims.

It was previously mentioned that tantalum, tungsten and molybdenum, referred to as refractory metals, were well-suited for use in masks except for the problem of achieving sufficient accuracy in the fabrication. Platinum is another metal which falls in this category.

Other refractory materials which are well-suited for use in masks, except for the problem of high-precision fabrication, include non-metals such as quartz ($SiO_2$), thoria ($ThO_2$), alumina $Al_2O_3$ and beryllia ($BeO$).

The metals enumerated have high melting points, are hard to dissolve, and/or difficult or impossible to deposit electrolytically. The same is true of the non-metals except that they cannot be electrodeposited at all.

In accordance with the present invention a form or replica of the mask to be fabricated is made with utmost accuracy from a material which is adapted to such fabrication and which is susceptible to dissolution. The other properties of the material which might render it unsuitable for use in a mask, need not be considered. Nickel is admirably adapted to the purpose.

The replica is then subjected to a vapor deposition treatment, carried out under conditions of high vacuum, so as to deposit on one surface of the replica a cohesive coating of the refractory material selected for the mask.

After a sufficient thickness of the refractory coating has been deposited the replica is dissolved away, preferably by simple chemical dissolution although resort may be had to electrolytic dissolution (erosion) of the replica. In the specific case of a nickel replica, it may be removed by chemical reaction, viz., formation of the carbonyl.

Following is a specific example of the application of the method to forming a tantalum mask.

A nickel replica of extreme accuracy was prepared by conventional means and disposed above the vapor source in an enclosure or chamber, exhausted to a very high vacuum. The nickel replica was supported about its perimeter by a suitable frame or holder having a thermal expansion coefficient closely matching or, if possible, identical to that of the material to be deposited; in this case a tantalum holder was used. This prevents the creation of thermal stresses.

The vapor source consisted of a pencil of tantalum heated at its end and vaporized by electron bombardment.

After deposition of the tantalum coating, the coated replica, still in the holder, was removed from the vaporizing apparatus and both were immersed in a diluted nitric acid solution until the nickel replica had completely dissolved.

The resulting product was a tantalum mask having substantially the same accuracy as the nickel replica, mounted in a tantalum frame.

While there have been described what at present are believed to be the preferred embodiments of this invention, it will be obvious to those skilled in the art that various changes and modifications may be made therein without departing from the invention, and it is aimed, therefore, to cover in the appended claim all such changes and modifications as fall within the true spirit and scope of the invention.

What is claimed and desired to be secured by United States Letters Patent is:

A method of making high precision masks of the type used for vapor deposition of electrodes in the production of semiconductor devices, comprising: making an exact replica of the mask out of a metal susceptible to chemical dissolution and adapted to the facile production of such a replica with high precision; vapor depositing on one surface of said replica under high vacuum conditions a cohesive coating of a non-metallic refractory material selected from the group consisting of $SiO_2$, $Al_2O_3$, BeO and $ThO_2$; and thereafter dissolving away the replica by chemical means to which the coating material is impervious.

References Cited by the Examiner

UNITED STATES PATENTS

| | | | |
|---|---|---|---|
| 1,614,562 | 1/1927 | Laise | 156—18 |
| 2,732,288 | 1/1956 | Holman et al. | 204—143 |
| 2,886,502 | 5/1959 | Holland | 204—192 |
| 2,960,457 | 11/1960 | Kuhlman | 204—192 |
| 3,072,983 | 1/1963 | Brenner et al. | 117—5.5 XR |
| 3,073,770 | 1/1963 | Sinclair et al. | 204—192 |
| 3,139,658 | 7/1964 | Brenner et al. | |

OTHER REFERENCES

IBM Technical Disclosure Bulletin, vol. 3, No. 5, Oct. 1960, "Molybdenum Cleaning Solution," 1 page.

JOHN H. MACK, *Primary Examiner.*

R. K. MIHALEK, *Assistant Examiner.*